US012805017B2

(12) United States Patent
Yoshikawa et al.

(10) Patent No.: US 12,805,017 B2
(45) Date of Patent: Nov. 17, 2026

(54) ELECTRONIC COMPONENT AND MANUFACTURING METHOD THEREFOR

(71) Applicant: TDK Corporation, Tokyo (JP)

(72) Inventors: Kazuhiro Yoshikawa, Tokyo (JP); Takeshi Oohashi, Tokyo (JP); Mitsuhiro Tomikawa, Tokyo (JP); Futa Gakiya, Tokyo (JP); Akiyasu Iioka, Tokyo (JP); Kouichi Tsunoda, Tokyo (JP); Kenichi Yoshida, Tokyo (JP)

(73) Assignee: TDK Corporation, Tokyo (JP)

( * ) Notice: Subject to any disclaimer, the term of this patent is extended or adjusted under 35 U.S.C. 154(b) by 1105 days.

(21) Appl. No.: 17/910,612

(22) PCT Filed: Mar. 12, 2021

(86) PCT No.: PCT/JP2021/009985
§ 371 (c)(1),
(2) Date: Sep. 9, 2022

(87) PCT Pub. No.: WO2021/193132
PCT Pub. Date: Sep. 30, 2021

(65) Prior Publication Data

US 2023/0138154 A1 May 4, 2023

(30) Foreign Application Priority Data

Mar. 25, 2020 (JP) ................................ 2020-053614
Mar. 25, 2020 (JP) ................................ 2020-053615

(51) Int. Cl.
*H10D 86/85* (2025.01)
*H10D 1/20* (2025.01)
*H10D 1/68* (2025.01)

(52) U.S. Cl.
CPC ............... *H10D 86/85* (2025.01); *H10D 1/20* (2025.01); *H10D 1/696* (2025.01)

(58) Field of Classification Search
CPC ........... H10D 86/85; H10D 1/20; H10D 1/696
(Continued)

(56) References Cited

U.S. PATENT DOCUMENTS 6,590,473 B1 * 7/2003 Seo ........................ H10D 84/00
333/175
10,111,335 B2 * 10/2018 Furuta ...................... H05K 1/16
(Continued)

FOREIGN PATENT DOCUMENTS

JP 2002222712 A * 8/2002
JP 2002324730 A * 11/2002
JP 2008-034626 A 2/2008

OTHER PUBLICATIONS

International Search Report issued in corresponding International Patent Application No. PCT/JP2021/009985, dated May 18, 2021, with English translation.

*Primary Examiner* — Shawki S Ismail
(74) *Attorney, Agent, or Firm* — Rimon P.C.

(57) ABSTRACT

An electronic component includes conductor layers and insulating resin layers which are alternately stacked on a substrate. One of the insulating resin layers positioned in the lowermost layer is smaller in thickness than the insulating resin layers, and the insulating resin layers are smaller in thermal expansion coefficient than the one of the insulating resin layers. Thus, an element that requires high processing accuracy, such as a capacitor, can be embedded in the insulating resin layer positioned in the lowermost layer and having a small thickness, and an element that requires a sufficient conductor thickness, such as an inductor, can be embedded in the insulating resin layers having a large thickness. In addition, since the insulating resin layers each (Continued)

have a small thermal expansion coefficient, the occurrence of warpage and peeling can be suppressed.

10 Claims, 10 Drawing Sheets

(58) Field of Classification Search
USPC ......... 336/105, 200; 333/185, 175, 167, 140
See application file for complete search history.

(56) References Cited

U.S. PATENT DOCUMENTS

2008/0023219 A1 1/2008 Yoshizawa et al.
2009/0084596 A1* 4/2009 Inoue ..................... H05K 1/185
29/846
2015/0371781 A1* 12/2015 Choi ........................ H01G 4/30
361/767
2023/0411288 A1* 12/2023 Sasaki ...................... H10D 1/68

* cited by examiner

ELECTRONIC COMPONENT AND MANUFACTURING METHOD THEREFOR

CROSS REFERENCE TO RELATED APPLICATIONS

This application is the U.S. National Phase under 35 U.S.C. § 371 of International Application No. PCT/JP2021/009985, filed on Mar. 12, 2021, which claims the benefit of Japanese Patent Application No. 2020-053614, filed on Mar. 25, 2020 and Japanese Patent Application No. 2020-053615, filed on Mar. 25, 2020, the entire contents of each are hereby incorporated by reference.

TECHNICAL FIELD

The present invention relates to an electronic component and a manufacturing method therefore and, more particularly, to an electronic component having a structure in which a plurality of conductor layers and a plurality of insulating layers are alternately stacked on a substrate and a manufacturing method therefor.

BACKGROUND ART

Patent Document 1 discloses an LC filter having a configuration in which a capacitor and an inductor are formed on a substrate. In the LC filter described in Patent Document 1, a lower electrode of the capacitor and a coil pattern constituting the inductor are disposed in the same conductor layer.

CITATION LIST

Patent Document

[Patent Document 1] JP 2008-034626A

SUMMARY OF THE INVENTION

Problem to be Solved by the Invention

However, when the conductor thickness of the coil pattern is increased so as to increase the Q-value of the coil in the configuration in which the capacitor lower electrode and the coil pattern are disposed in the same conductor layer, the conductor thickness of the capacitor lower electrode is inevitably increased. This makes it difficult to form an upper electrode on the lower electrode with high accuracy, which may increase variation in capacitance.

An object of the present invention is therefore to, in an electronic component integrating an element that requires high processing accuracy, such as a capacitor, and an element that requires a sufficient conductor thickness, such as an inductor, satisfy characteristics required for both of the elements. Another object of the present invention is to provide a manufacturing method for such an electronic component.

Means for Solving the Problem

An electronic component according to an aspect of the present invention includes: a substrate; and a plurality of conductor layers and a plurality of insulating resin layers which are alternately stacked on the substrate. The plurality of insulating resin layers include a first insulating resin layer positioned in the lowermost layer and a plurality of second insulating resin layers positioned on the first insulating resin layer. The plurality of conductor layers include a first conductor layer embedded in the first insulating resin layer and a plurality of second conductor layers embedded respectively in the plurality of second insulating resin layers. The first conductor layer includes a capacitor constituted by a lower electrode and an upper electrode stacked on the lower electrode through a dielectric film made of an inorganic insulating material. The plurality of second conductor layers include a coil pattern. The first insulating resin layer is smaller in thickness than each of the second insulating resin layers, and the second insulating resin layers are smaller in thermal expansion coefficient than the first insulating resin layer.

According to the present invention, a capacitor requiring high processing accuracy is embedded in the first insulating resin layer positioned in the lowermost layer and having a small thickness, and an inductor requiring a sufficient conductor thickness is embedded in the second insulating resin layers having a large thickness, so that characteristics required for both of the elements can be satisfied. In addition, since the second insulating resin layers have a small thermal expansion coefficient, the occurrence of warpage and peeling can be suppressed. The first insulating resin layer can be made of polyimide-based resin. The second insulating resin layers can be made of a material obtained by adding fillers to epoxy-based resin.

In the present invention, each of the plurality of second conductor layers may have a larger thickness than the total thickness of the upper and lower electrodes. This can increase the Q-value of the coil.

In the present invention, a first via conductor provided so as to penetrate the first insulating resin layer and connecting the first and second conductor layers may have a rectangular planar shape, and a second via conductor provided so as to penetrate the second insulating resin layer and connecting different second conductor layers may have a circular planar shape. This can ensure a sufficient area for the first via conductor and prevent the occurrence of peeling in the vicinity of the second via conductor.

In the present invention, the first insulating resin layer may be partly removed, and one of the plurality of second insulating resin layers that contacts the first insulating resin layer may be embedded in a portion where the first insulating resin layer has been removed. This increases the volume of the second insulating resin layer having a small thermal expansion coefficient, thus making warpage of the entire electronic component less likely to occur.

An electronic component manufacturing method according to an aspect of the present invention includes: a first step of forming, on a substrate, a first conductor layer including a capacitor constituted by a lower electrode and an upper electrode stacked on the lower electrode through a dielectric film made of an inorganic insulating material; a second step of forming a first insulating resin layer that covers the first conductor layer; and a third step of alternately forming, on the first insulating resin layer, second conductor layers including a coil pattern and second insulating resin layers larger in thickness and smaller in thermal expansion coefficient than the first insulating resin layer.

According to the present invention, it is possible to form a capacitor requiring high processing accuracy in the first conductor layer and to form an inductor requiring a sufficient conductor thickness in the second conductor layer. In addition, since the second insulating resin layer has a small thermal expansion coefficient, the occurrence of warpage and peeling can be suppressed.

In the present invention, the first insulating resin layer may be formed by a coating method in the second step, and the second insulating resin layer may be formed by a lamination method in the third step. This facilitates the formation of the first and second insulating resin layers different in thickness.

In the present invention, the second conductor layer may have a first via conductor and a second via conductor, the first via conductor being provided so as to penetrate the first insulating resin layer and connecting the first conductor layer and one of a plurality of the second conductor layers that is positioned in the lowermost layer, the second via conductor being provided so as to penetrate the second insulating resin layers and connecting the plurality of second insulating resin layers. The first via conductor may have a flat bottom, and the surfaces of the plurality of second conductor layers each have a recess at a portion thereof connected to the second via conductor. The bottom of the second via conductor may be projected so as to bite into the recess. Since the bottom of the first via conductor is thus flat, variation in capacitance due to the surface irregularity of the lower electrode or upper electrode can be suppressed. On the other hand, since the bottom of the second via conductor is projected so as to bite into the recess, the contact area between the second conductor layer and a third conductor layer increases, thus making it possible to enhance adhesion therebetween.

In the present invention, the first via conductor may have a rectangular planar shape, and the second via conductor may have a circular planar shape. This can ensure a sufficient area for the first via conductor and prevent the occurrence of peeling in the vicinity of the second via conductor.

In the present invention, each of the plurality of second conductor layers may have a larger thickness than the total thickness of the upper and lower electrodes. This can increase the Q-value of the coil.

The electronic component manufacturing method according to the aspect of the present invention may further include: a fourth step of exposing the first conductor layer by forming an opening in the first insulating resin layer; and a fifth step of exposing the second conductor layer by forming an opening in the second insulating resin layer. The fourth step may be performed by a photolithography method, and the fifth step may be performed by laser processing. Thus, it is possible to achieve high processing accuracy in the fourth step and to process the opening of the first insulating resin layer into a desired planar shape. Further, the fifth step can be performed at low cost, and a non-photosensitive material can be used as the material of the second insulating resin layer.

An electronic component according to another aspect of the present invention includes: a substrate; a first conductor layer formed on the substrate and including a capacitor constituted by a lower electrode and an upper electrode stacked on the lower electrode through a dielectric film made of an inorganic insulating material; a first insulating resin layer that covers the first conductor layer; a second conductor layer formed on the first insulating resin layer; a second insulating resin layer that covers the second conductor layer; and a third conductor layer formed on the second insulating resin layer. The second and third conductor layers each include a coil pattern. The first insulating resin layer has a first opening exposing the first conductor layer. The second insulating resin layer has a second opening exposing the second conductor layer. The second conductor layer has a first via conductor connected to the first conductor layer through the first opening. The third conductor layer has a second via conductor connected to the second conductor layer through the second opening. The first via conductor has a flat bottom, and the surface of the second conductor layer has a recess at a portion thereof connected to the second via conductor. The bottom of the second via conductor is projected so as to bite into the recess.

According to the present invention, an element that requires high processing accuracy, such as a capacitor, is embedded in the first insulating resin layer positioned in the lowermost layer, and an element that requires a sufficient conductor thickness, such as an inductor, is embedded in the second and third insulating resin layers, so that characteristics required for both of the elements can be satisfied. In addition, since the bottom of the first via conductor is flat, variation in capacitance due to the surface irregularity of the lower electrode or upper electrode can be suppressed. On the other hand, since the bottom of the second via conductor is projected so as to bite into the recess, the contact area between the second and third conductor layers increases, thus making it possible to enhance adhesion therebetween.

An electronic component manufacturing method according to another aspect of the present invention includes: a first step of forming, on a substrate, a first conductor layer including a capacitor constituted by a lower electrode and an upper electrode stacked on the lower electrode through a dielectric film made of an inorganic insulating material; a second step of forming a first insulating resin layer that covers the first conductor layer; a third step of forming a first opening exposing the first conductor layer in the first insulating resin layer using a photolithography method; a fourth step of forming, on the first insulating resin layer, a second conductor layer including a coil pattern such that the second conductor layer is connected to the first conductor layer through the first opening; a fifth step of forming a second insulating resin layer that covers the second conductor layer; a sixth step of forming, in the second insulating resin layer, a second opening exposing the second conductor layer using laser processing; a seventh step of forming a recess in the surface of the second conductor layer exposed through the second opening; and an eighth step of forming, on the second insulating resin layer, a third conductor layer including a coil pattern such that the third conductor layer is connected to the second conductor layer through the second opening.

According to the present invention, it is possible to form a capacitor requiring high processing accuracy in the first conductor layer and to form an inductor requiring a sufficient conductor thickness in the second conductor layer. In addition, after the second opening is formed in the second insulating resin layer by laser processing, a recess is formed in the surface of the second conductor layer exposed through the second opening, so that the contact area between the second and third conductor layers increases, thereby enhancing adhesion therebetween. Further, the second opening can be formed at low cost, and a non-photosensitive material can be used as the material of the second insulating resin layer. On the other hand, the first opening is formed by a photolithography method, so that it is possible to achieve high processing accuracy in the formation of the first opening and to process the first opening into a desired planar shape.

In the present invention, the first insulating resin layer may be formed by a coating method in the second step, and the second insulating resin layer may be formed by a lamination method in the fifth step. This facilitates the formation of the first and second insulating resin layers different in thickness.

Advantageous Effects of the Invention

As described above, according to the present invention, in an electronic component integrating an element that requires high processing accuracy, such as a capacitor, and an element that requires a sufficient conductor thickness, such as an inductor, characteristics required for both of the elements can be satisfied.

MODE FOR CARRYING OUT THE INVENTION

Hereinafter, preferred embodiments of the present invention will be described in detail with reference to the accompanying drawings.

Figure 1:
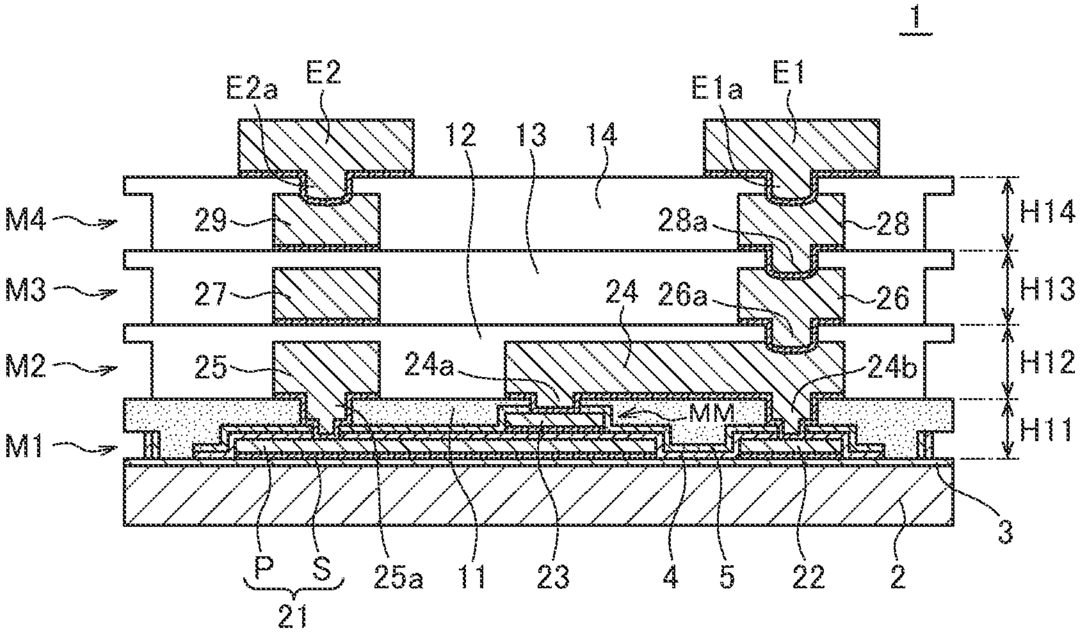
FIG. 1 is a cross-sectional view for explaining the structure of an electronic component 1 according to an embodiment of the present invention.

FIG. 1 is a cross-sectional view for explaining the structure of an electronic component 1 according to an embodiment of the present invention.

As illustrated in FIG. 1, the electronic component 1 according to the present embodiment includes a substrate 2, conductor layers M1 to M4, and insulating resin layers 11 to 14. The conductor layers M1 to M4 and insulating resin layers 11 to 14 are alternately stacked on the upper surface of the substrate 2. The material of the substrate 2 may be any material as long as it is chemically and thermally stable, generates less stress, and can maintain surface smoothness, and examples thereof include, but not particularly limited thereto, silicon single crystal, alumina, sapphire, aluminum nitride, MgO single crystal, $SrTiO_3$ single crystal, surface-oxidized silicon, glass, quartz, and ferrite. The surface of the substrate 2 is covered with a planarizing layer 3. The planarizing layer 3 may be made of, e.g., alumina or silicon oxide.

The conductor layer M1 is a layer positioned in the lowermost layer and includes conductor patterns 21 and 22. The conductor patterns 21 and 22 are each constituted of a thin seed layer S contacting the planarizing layer 3 and a plating layer P provided on the seed layer S and having a film thickness larger than that of the seed layer S. Similarly, the conductor patterns positioned in other conductor layers are each formed of a laminated body of the seed layer S and plating layer P. The conductor pattern 21 constitutes a lower electrode of a capacitor, and the upper and side surfaces thereof are covered with a dielectric film (capacitive insulating film) 4. The dielectric film 4 is removed at the outer peripheral portion of the electronic component 1, whereby stress is relieved.

A conductor pattern 23 is formed on the upper surface of the conductor pattern 21 through the dielectric film 4. The conductor pattern 23 belongs to a conductor layer MM positioned between the conductor layers M1 and M2 and constitutes a capacitor upper electrode. Thus, there is formed a capacitor having the conductor pattern 21 as the lower electrode and the conductor pattern 23 as the upper electrode. The conductor layers M1 and MM are covered with the insulating resin layer 11 through a passivation film 5. In the present embodiment, the dielectric film 4 and passivation film 5 are both made of an inorganic insulating material. The inorganic insulating material constituting the dielectric film 4 and that constituting the passivation film 5 may be the same or different. The passivation film 5 is removed at the outer peripheral portion of the electronic component 1, whereby stress is relieved.

The conductor layer M2 is the second conductor layer that is provided on the surface of the insulating resin layer 11 and includes conductor patterns 24 and 25. The conductor pattern 24 is connected to the conductor patterns 23 and 22 through respective via conductors 24*a* and 24*b*. The conductor pattern 25 is connected to the conductor pattern 21 through a via conductor 25*a*. The conductor layer M2 is covered with the insulating resin layer 12.

The conductor layer M3 is the third conductor layer that is provided on the surface of the insulating resin layer 12 and includes conductor patterns 26 and 27. The conductor pattern 26 is connected to the conductor pattern 24 through a via conductor 26*a*. The conductor layer M3 is covered with the insulating resin layer 13.

The conductor layer M4 is the fourth conductor layer that is provided on the surface of the insulating resin layer 13 and includes conductor patterns 28 and 29. The conductor pattern 28 is connected to the conductor pattern 26 through a via conductor 28*a*. The conductor layer M4 is covered with the insulating resin layer 14.

Terminal electrodes E1 and E2 are provided on the upper surface of the insulating resin layer 14. The terminal electrodes E1 and E2 are connected to the conductor patterns 28 and 29, respectively, through via conductors Ela and E2*a*. The conductor patterns 22 and 24 to 29 each constitute a part of a coil pattern, for example, whereby a capacitor and an inductor are integrated on the substrate 2.

In the present embodiment, the material constituting the insulating resin layer 11 and the material constituting the insulating resin layers 12 to 14 differ from each other. Specifically, as the material of the insulating resin layer 11, a photosensitive material such as polyimide-based resin that is capable of easily forming the insulating resin layer by a coating method (e.g., a spin-coating method). On the other hand, as the material of the insulating resin layers 12 to 14, a material such as one obtained by adding fillers to epoxy-based resin that is capable of easily adjusting a thermal expansion coefficient and forming the insulating resin layer by a lamination method can be used.

As illustrated in FIG. 1, assuming that the thicknesses of the insulating resin layers 11 to 14 are H11 to H14, respectively, H11<H12, H13, H14 is satisfied in the present embodiment. That is, the insulating resin layer 11 is smaller in thickness than the insulating resin layers 12 to 14. This means that the total thickness of the conductor layers M1 and MM embedded in the insulating resin layer 11 is smaller than the thickness of each of the conductor layers M2 to M4 that are embedded in the respective insulating resin layers 12 to 14. For example, the thickness of each of the conductor layers M2 to M4 can be set to 20 μm, and the thickness of each of the conductor layers M1 and MM can be set to 5 μm. Since the conductor thickness of each of the conductor patterns 21 to 23 formed in the conductor layers M1 and MM is thus small, the lower and upper electrodes constituting the capacitor can be formed with high accuracy. On the other hand, each of the conductor patterns 24 to 29 formed in the conductor layers M2 to M4 has a sufficient conductor thickness, thus making it possible to increase the Q-value of the coil.

Further, in the present embodiment, the insulating resin layers 12 to 14 have a thermal expansion coefficient smaller than that of the insulating resin layer 11. Thus, it is possible to prevent peeling at the boundary between the insulating resin layers 12 to 14 having a large thickness and the conductor patterns 24 to 29 and to make warpage of the entire electronic component 1 less likely to occur. The thermal expansion coefficient of the insulating resin layers 12 to 14 can be adjusted by the amount and material of the fillers to be added to the insulating resin layers 12 to 14. As the material of the fillers, a material having a small thermal expansion coefficient, such as silica, can be used. Although the insulating resin layer 11 is larger in thermal expansion coefficient than the insulating resin layers 12 to 14, it is smaller in thickness than the insulating resin layers 12 to 14, so that the insulating resin layer 11 is not subjected to strong stress and thus less subjected to peeling or the like. The substrate 2 is preferably smaller in thermal coefficient than the insulating resin layers 12 to 14. As described above, the insulating resin layer 11 having a large thermal expansion coefficient is sandwiched by the substrate 2 and the insulating resin layers 12 to 14 having a smaller thermal expansion coefficient, thereby making it possible to suppress warpage of the entire electronic component 1.

Further, the conductor layers M1 and MM each have a flat surface, and the via conductors 24*a*, 24*b*, and 25*a* connecting the conductor layer M2 and the conductor layers M1, MM each have a flat bottom. This suppresses variation in capacitance due to the surface irregularity of the lower electrode or upper electrode. On the other hand, the surfaces of the conductor layers M2 to M4 each have a recess, and the bottoms of the via conductors 26*a*, 28*a*, E1*a*, and E2*a* each have a projection biting into the recess of each of the conductor layers M2 to M4. This increases the contact areas between the via conductors 26*a*, 28*a*, E1*a*, E2*a* and the conductor patterns 24, 26, 28, 29 connected thereto, thereby enhancing adhesion therebetween.

In the present embodiment, the planar shape of each of the via conductors 24*a*, 24*b*, and 25*a* having a flat bottom may be formed into a rectangular shape, and the planar shape of each of the via conductors 26*a*, 28*a*, Ela, and E2*a* having a projecting bottom may be formed into a circular shape. Thus, it is possible to increase the contact areas of the via conductors 24*a*, 24*b*, and 25*a* and to prevent the occurrence of peeling around the via conductors 26*a*, 28*a*, Ela, and E2*a*.

Of the via conductors 24*a*, 24*b*, and 25*a*, the via conductor 24*a* connected to the conductor pattern 23 which is the upper electrode is provided so as to penetrate the insulating resin layer 11 and passivation film 5, while the via conductors 24*b* and 25*a* connected to the conductor patterns 21 and 22 which is the lower electrode or coil pattern are provided so as to penetrate the insulating resin layer 11, passivation film 5, and dielectric film 4. That is, the via conductor 24*a* penetrates an inorganic insulating film of a single layer, while the via conductors 24*b* and 25*a* penetrate an inorganic insulating film of two layers. This is because, except an area where the conductor pattern 23 which is the upper electrode, the upper surfaces of the conductor patterns 21 and 22 are covered with an inorganic insulating film of two layers constituted of the dielectric film 4 and passivation film 5. Since the upper surfaces of the conductor patterns 21 and 22 are thus covered with inorganic insulating film of two layers constituted of the dielectric film 4 and passivation film 5, it is possible to protect the conductor patterns 21 and 22 more effectively.

The following describes a manufacturing method for the electronic component 1 according to the present embodiment.

FIGS. 2 to 24 are process views for explaining the manufacturing method for the electronic component 1 according to the present embodiment. While many pieces of the electronic components 1 are obtained from an aggregate substrate in the manufacturing process for the electronic component 1, the following description will be given focusing on the manufacturing process for a single electronic component 1.

Figure 2:
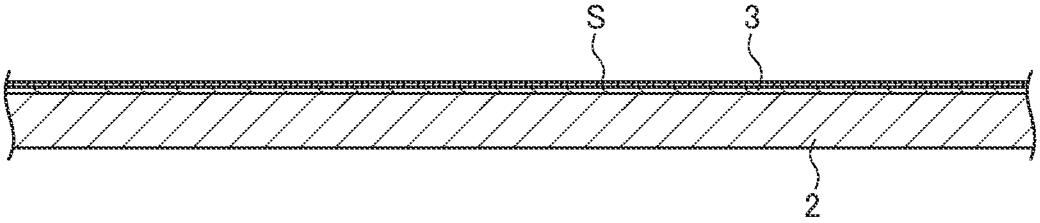
FIG. 2 is a process view for explaining the manufacturing method for the electronic component 1.
Figure 3:
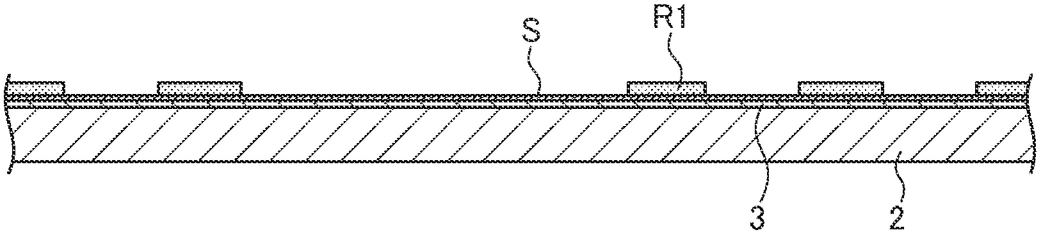
FIG. 3 is a process view for explaining the manufacturing method for the electronic component 1.
Figure 4:
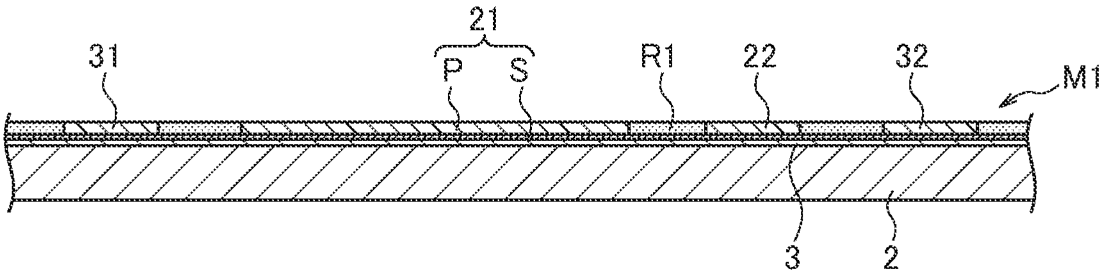
FIG. 4 is a process view for explaining the manufacturing method for the electronic component 1.
Figure 5:
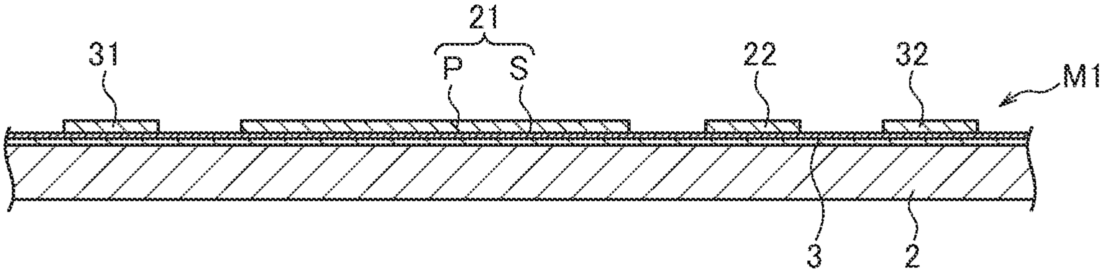
FIG. 5 is a process view for explaining the manufacturing method for the electronic component 1.
Figure 6:
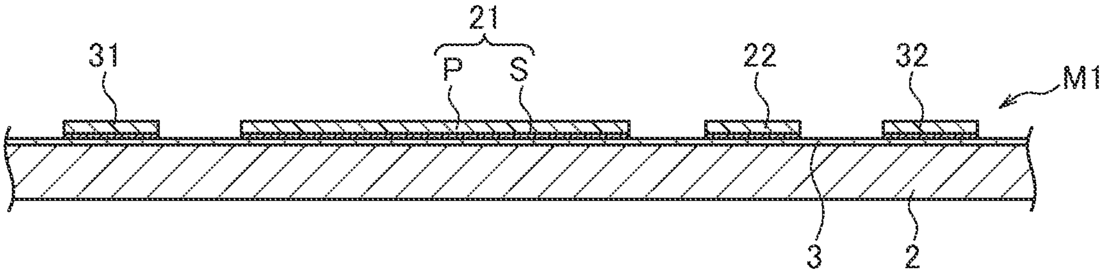
FIG. 6 is a process view for explaining the manufacturing method for the electronic component 1.

As illustrated in FIG. 2, the planarizing layer 3 is formed by sputtering or the like on the substrate (aggregate substrate) 2, and the surface of the planarizing layer 3 is subjected to grinding or mirror finishing such as CMP for planarization. Thereafter, the seed layer S is formed by sputtering or the like on the surface of the planarizing layer 3. Subsequently, as illustrated in FIG. 3, a resist layer R1 is spin-coated on the seed layer S and then patterned so as to expose a part of the seed layer S on which the conductor layer M1 is to be formed. In this state, electrolyte plating is performed using the seed layer S as a feed to form a plating layer P on the seed layer S as illustrated in FIG. 4. A laminated body of the seed layer S and plating layer P constitute the conductor layer M1. In the cross section illustrated in FIG. 4, the conductor layer M1 includes the conductor patterns 21, 22 and sacrificial patterns 31, 32. Then, the resist layer R1 is removed as illustrated in FIG. 5, and the exposed part of the seed layer S is removed as illustrated in FIG. 6, whereby the conductor layer M1 is completed. The seed layer S can be removed by wet etching or ion milling.

Figure 7:
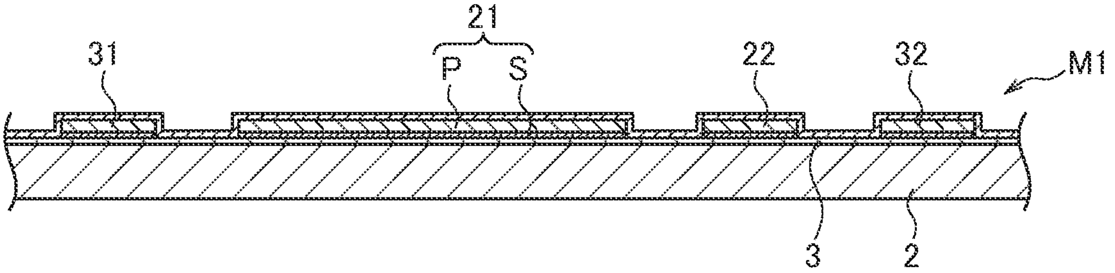
FIG. 7 is a process view for explaining the manufacturing method for the electronic component 1.

Then, as illustrated in FIG. 7, the dielectric film 4 is formed on the entire surface of the conductor layer M1 including the upper and side surfaces thereof. As the dielectric film 4, an inorganic insulating material including a paraelectric material such as silicon nitride (SiNx) or silicon oxide (SiOx) and other known ferroelectric material can be used. The dielectric film 4 can be formed by sputtering, plasma CVD, MOCVD, sol-gel, electron beam vapor deposition, or the like.

Figure 8:
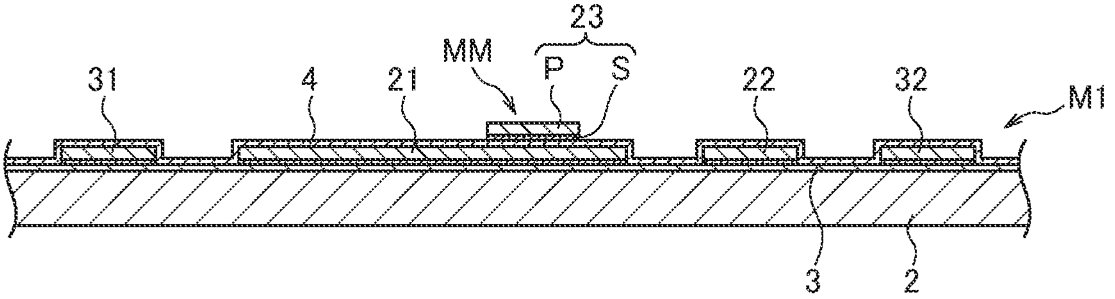
FIG. 8 is a process view for explaining the manufacturing method for the electronic component 1.
Figure 9:
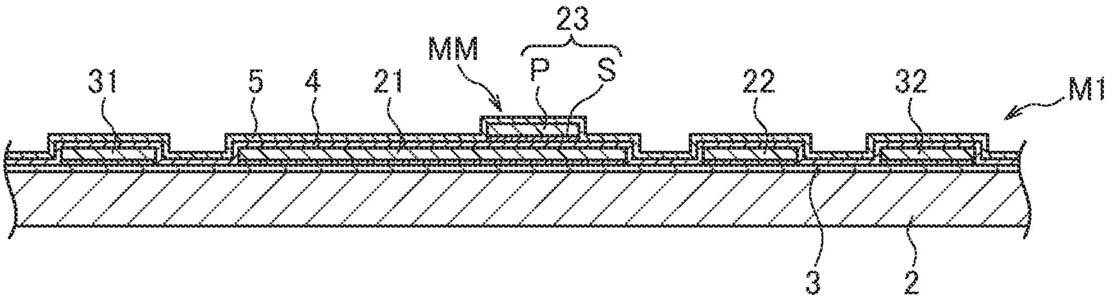
FIG. 9 is a process view for explaining the manufacturing method for the electronic component 1.

Then, as illustrated in FIG. 8, the same method as that for the conductor layer M1 is used to form the conductor pattern 23 on the upper surface of the conductor pattern 21 through the dielectric film 4. The conductor pattern 23 is also formed of a laminated body of the seed layer S and plating layer P. This completes the conductor layer MM to thereby form a capacitor having the conductor pattern 21 as the lower electrode and the conductor pattern 23 as the upper electrode. Then, as illustrated in FIG. 9, the passivation film 5 is formed on the entire surface including the upper and side surfaces of each of the conductor layers M1 and MM. As the passivation film 5, an inorganic insulating material that is the same as that for the dielectric film 4 can be used.

Figure 10:
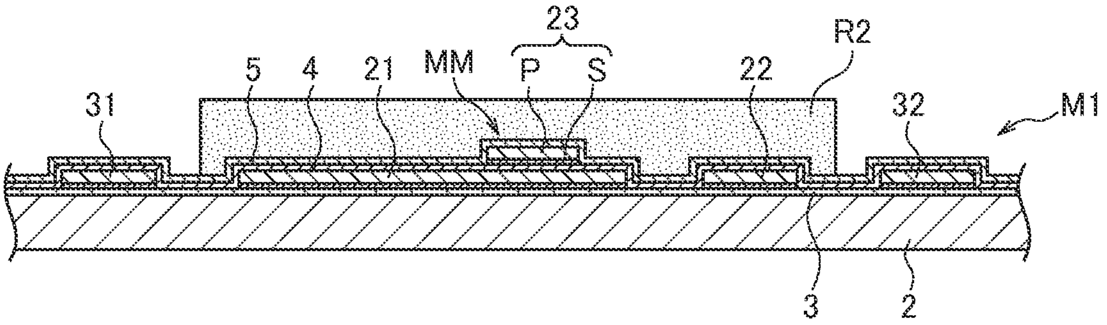
FIG. 10 is a process view for explaining the manufacturing method for the electronic component 1.
Figure 11:
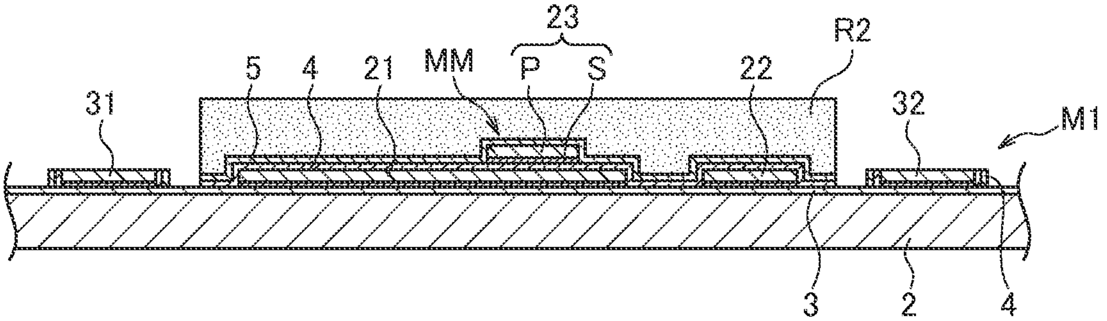
FIG. 11 is a process view for explaining the manufacturing method for the electronic component 1.

Then, as illustrated in FIG. 10, a resist layer R2 is formed so as to cover the conductor patterns 21 and 22 without covering the sacrificial patterns 31 and 32. The edge of the resist layer R2 is ultimately set slightly inside the edge of a part corresponding to the electronic component 1. In this state, the passivation film 5 and dielectric film 4 are ultimately etched to remove parts of the passivation film 5 and dielectric film 4 that correspond to the outer peripheral part of the electronic component 1, as illustrated in FIG. 11. The passivation film 5 and dielectric film 4 are preferably etched by a highly anisotropic etching method, such as ion milling. As a result, parts of the passivation film 5 and dielectric film 4 that are parallel to the substrate 2, that is, parts of the passivation film 5 and dielectric film 4 that cover the surface of the planarizing layer 3 and upper surfaces of the sacrificial patterns 31 and 32 are removed, while parts of the passivation film 5 and dielectric film 4 that are vertical to the substrate 2, that is, parts of the passivation film 5 and dielectric film 4 that cover the side surfaces of the sacrificial patterns 31 and 32 are left without being removed.

Figure 12:
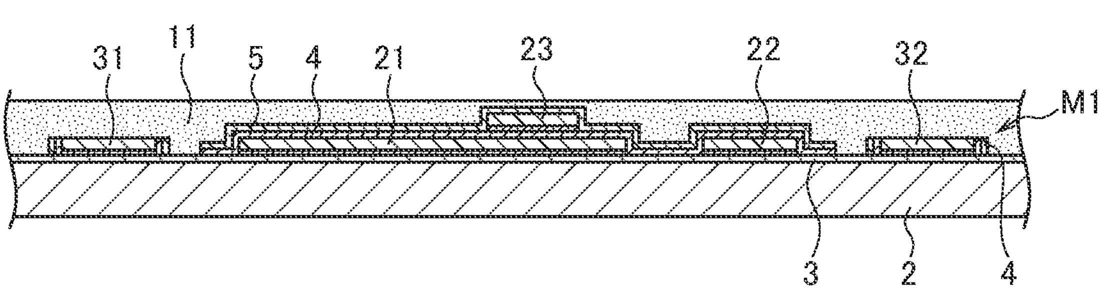
FIG. 12 is a process view for explaining the manufacturing method for the electronic component 1.
Figure 13:
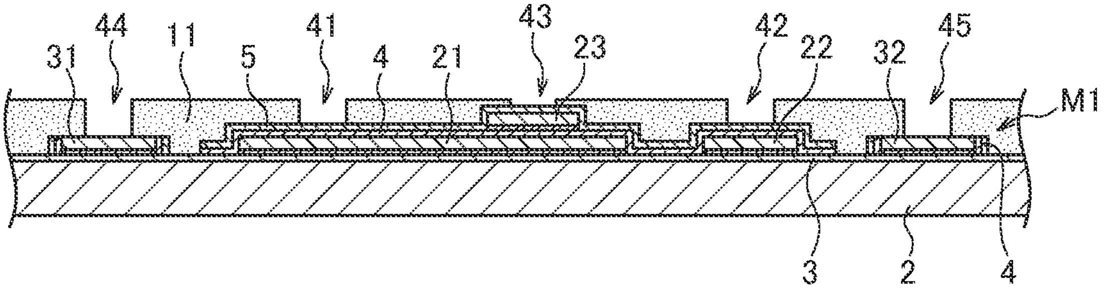
FIG. 13 is a process view for explaining the manufacturing method for the electronic component 1.

Then, as illustrated in FIG. 12, the insulating resin layer 11 is formed so as to cover the conductor layers M1 and MM. The insulating resin layer 11 is preferably formed by a coating method (e.g., a spin-coating method). This is because, since the total film thickness of the conductor layers M1 and MM is as small as, for example, about 10 μm, the insulating resin layer 11 can be formed at lower cost by using a coating method than by using a lamination method. As the material of the insulating resin layer 11, photosensitive polyimide-based resin can be used. Then, as illustrated in FIG. 13, the insulating resin layer 11 is patterned to form openings 41 to 45. The openings 41 to 45 can be formed by a photolithography method using a not-shown photomask. As a result, the passivation film 5 that covers the upper surfaces of the conductor patterns 21 to 23 is exposed through the openings 41 to 43, and the sacrificial patterns 31 and 32 are exposed respectively through the openings 44 and 45.

Figure 14:
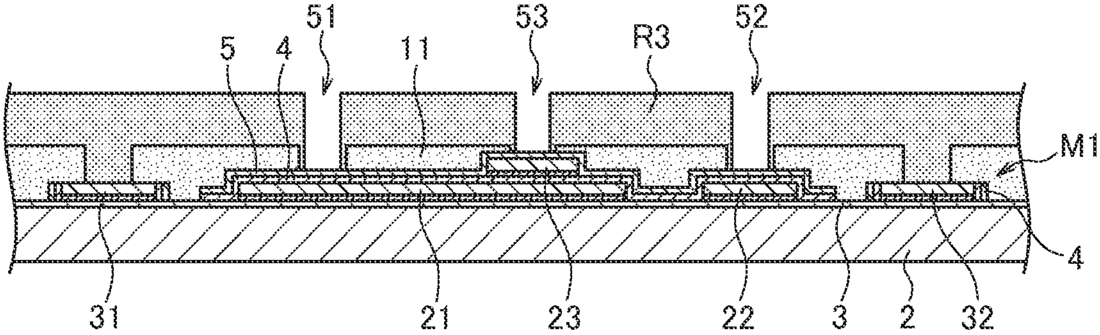
FIG. 14 is a process view for explaining the manufacturing method for the electronic component 1.

Then, as illustrated in FIG. 14, a resist layer R3 is formed on the insulating resin layer 11, and then openings 51 to 53 are formed in the resist layer R3. The openings 51 to 53 are formed at positions overlapping the openings 41 to 43, respectively. As a result, the passivation film 5 that covers the upper surfaces of the conductor patterns 21 to 23 are exposed through the openings 51 to 53. In this state, ion milling or the like is applied to remove the passivation film 5 and dielectric film 4 exposed to the openings 51 and 52 and to remove the passivation film 5 exposed through the opening 53. As a result, the upper surfaces of the conductor patterns 21 to 23 are exposed at positions overlapping the openings 51 to 53.

Figure 15:
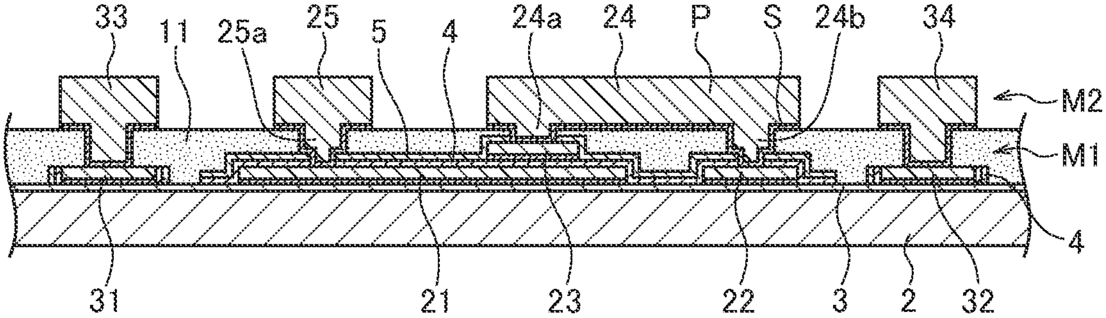
FIG. 15 is a process view for explaining the manufacturing method for the electronic component 1.

After removal of the resist layer R3, the conductor layer M2 is formed on the insulating resin layer 11 using the same method as the formation method for the conductor layer M1, as illustrated in FIG. 15. In the cross section illustrated in FIG. 15, the conductor layer M2 includes the conductor patterns 24, 25 and sacrificial patterns 33, 34. The conductor patterns and sacrificial patterns constituting the conductor layer M2 are each also formed of a laminated body of the seed layer S and plating layer P. The conductor pattern 24 is connected to the conductor patterns 22 and 23 through openings formed in the insulating resin layer 11, and the conductor pattern 25 is connected to the conductor pattern 21 through an opening formed in the insulating resin layer 11. Parts of the conductor patterns 24 and 25 that are positioned inside the openings of the insulating resin layer 11 constitute the via conductors 24*a*, 24*b* and 25*a*. Further, the sacrificial patterns 33 and 34 are connected respectively to the sacrificial patterns 31 and 32 through openings formed in the insulating resin layer 11.

Figure 16:
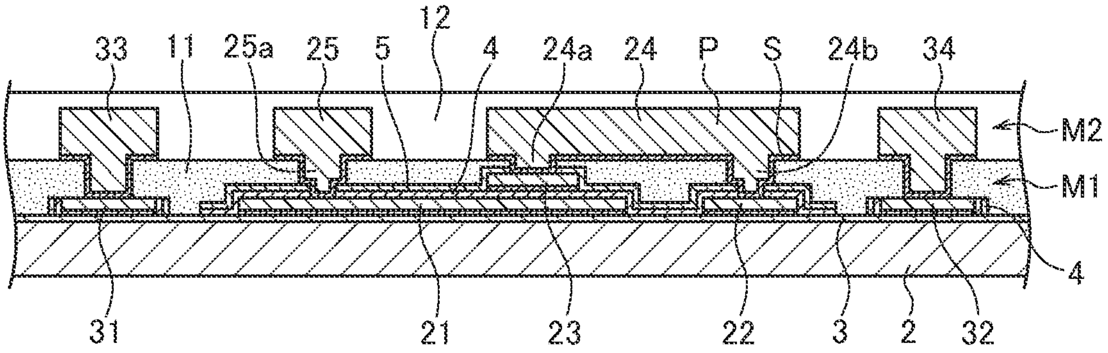
FIG. 16 is a process view for explaining the manufacturing method for the electronic component 1.

Then, as illustrated in FIG. 16, the insulating resin layer 12 is formed so as to cover the conductor layer M2. The insulating resin layer 12 is preferably formed by a lamination method. This is because, since the film thickness of the conductor layer M2 is as large as, for example about 20 μm, the insulating resin layer 12 can be formed at lower cost by using a lamination method than by using a coating method. As the material of the insulating resin layer 12, non-photosensitive polyimide-based resin can be used. Fillers for adjusting a thermal expansion coefficient are added to the insulating resin layer 12, whereby the insulating resin layer 12 has a smaller thermal expansion coefficient than the insulating resin layer 11.

Figure 17:
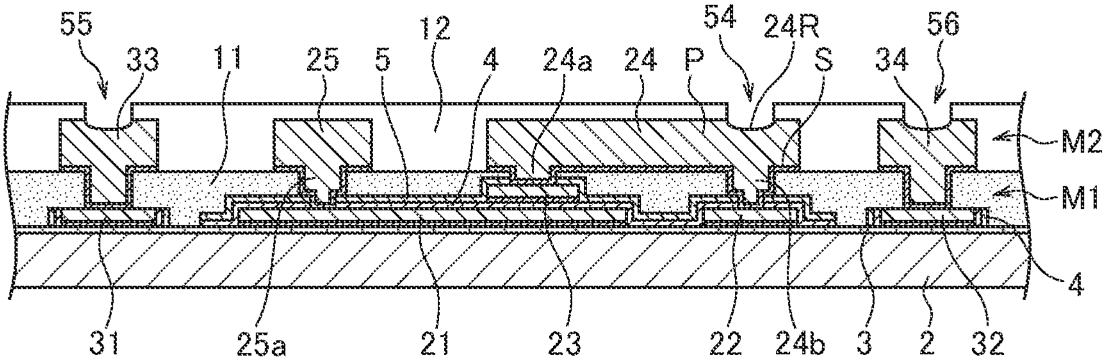
FIG. 17 is a process view for explaining the manufacturing method for the electronic component 1.

Then, as illustrated in FIG. 17, openings 54 to 56 are formed in the insulating resin layer 12. The openings 54 to 56 can be formed by laser processing. As a result, the conductor pattern 24 is exposed through the opening 54, and sacrificial patterns 33 and 34 are exposed respectively through the openings 55 and 56. After that, desmear treatment is performed using permanganate or the like to remove the residues inside the openings 54 to 56. At the same time, the surface of the conductor pattern 24 exposed through the opening 54 is etched to form a recess 24R. A recess like the recess 24R is also formed in the surface of each of the sacrificial patterns 33 and 34. The shape of the recess 24R can be adjusted by the desmear treatment time or type of a solution to be used. In addition to the desmear treatment, an etching process for forming the recess 24R in the conductor pattern 24 may be performed.

Figure 18:
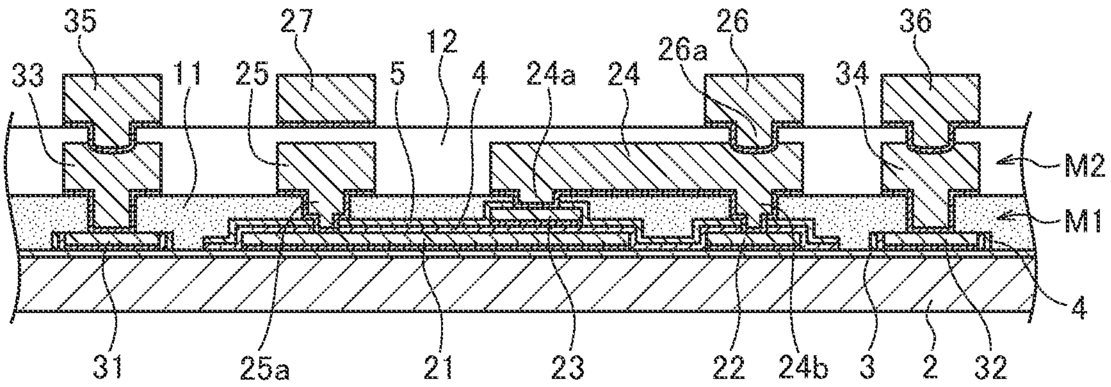
FIG. 18 is a process view for explaining the manufacturing method for the electronic component 1.

Then, as illustrated in FIG. 18, the conductor layer M3 is formed on the insulating resin layer 12 using the same method as the formation method for the conductor layer M1.

In the cross section illustrated in FIG. 18, the conductor layer M3 includes the conductor patterns 26, 27 and sacrificial patterns 35, 36. The conductor patterns and sacrificial patterns constituting the conductor layer M3 are each also formed of a laminated body of the seed layer S and plating layer P. The conductor pattern 26 is connected to the conductor pattern 24 through an opening formed in the insulating resin layer 12. A part of the conductor pattern 26 positioned inside the opening of the insulating resin layer 12 constitutes the via conductor 26*a*, and the bottom thereof is projected so as to bite into the recess 24R. The sacrificial patterns 35 and 36 are connected to the sacrificial patterns 33 and 34, respectively, through openings formed in the insulating resin layer 12.

Figure 19:
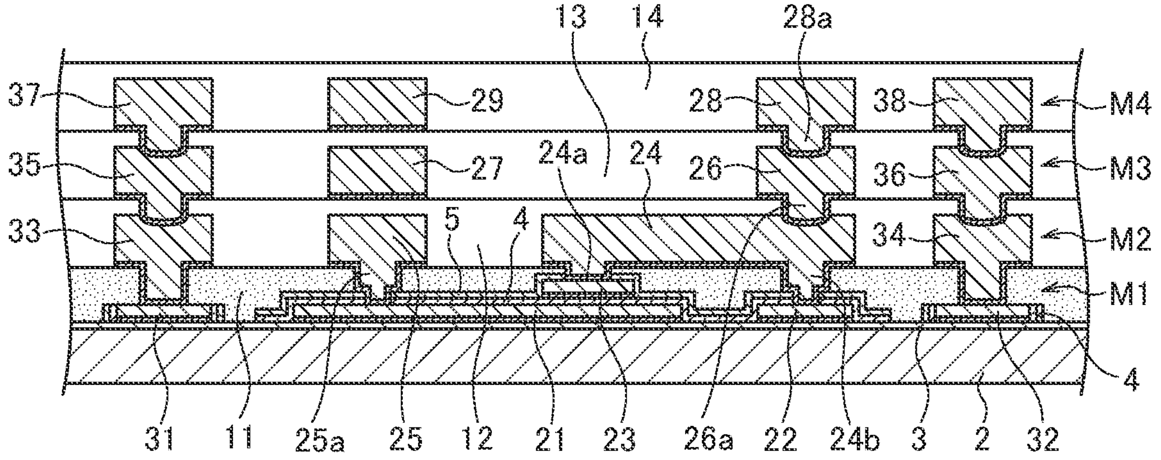
FIG. 19 is a process view for explaining the manufacturing method for the electronic component 1.

Thereafter, the same process is repeated to form the insulating resin layer 13, conductor layer M4, and insulating resin layer 14 in this order, as illustrated in FIG. 19. The insulating resin layers 13 and 14 can also be formed by a lamination method. In the cross section illustrated in FIG. 19, the conductor layer M4 includes the conductor patterns 28, 29 and sacrificial patterns 37, 38. The conductor pattern 28 is connected to the conductor pattern 26 through an opening formed in the insulating resin layer 13, and the sacrificial patterns 37 and 38 are connected to the sacrificial patterns 35 and 36, respectively, through openings formed in the insulating resin layer 13. A part of the conductor pattern 28 positioned inside the opening of the insulating resin layer 13 constitutes the via conductor 28*a*, and the bottom thereof is projected so as to bite into the recess formed in the conductor pattern 26.

Figure 20:
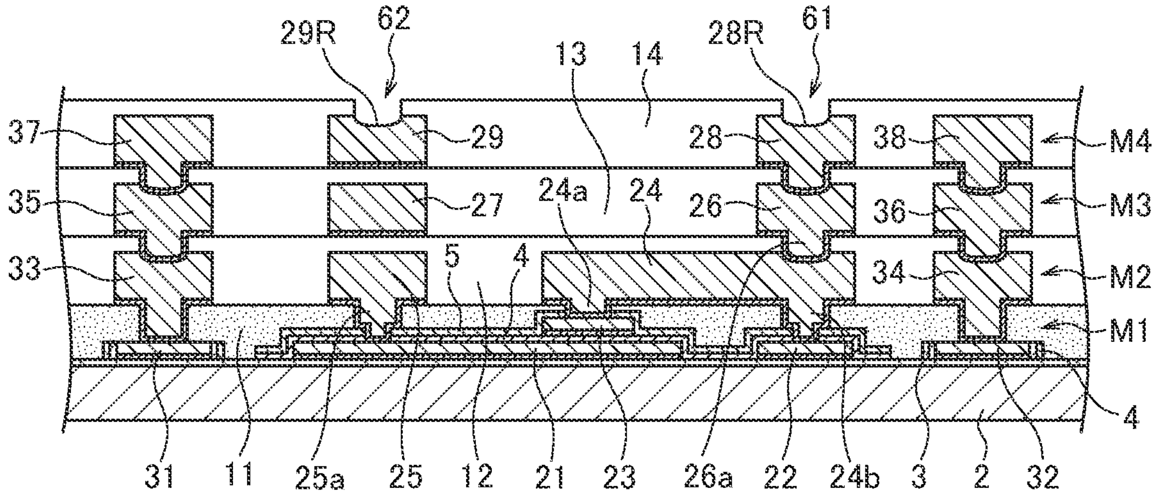
FIG. 20 is a process view for explaining the manufacturing method for the electronic component 1.
Figure 21:
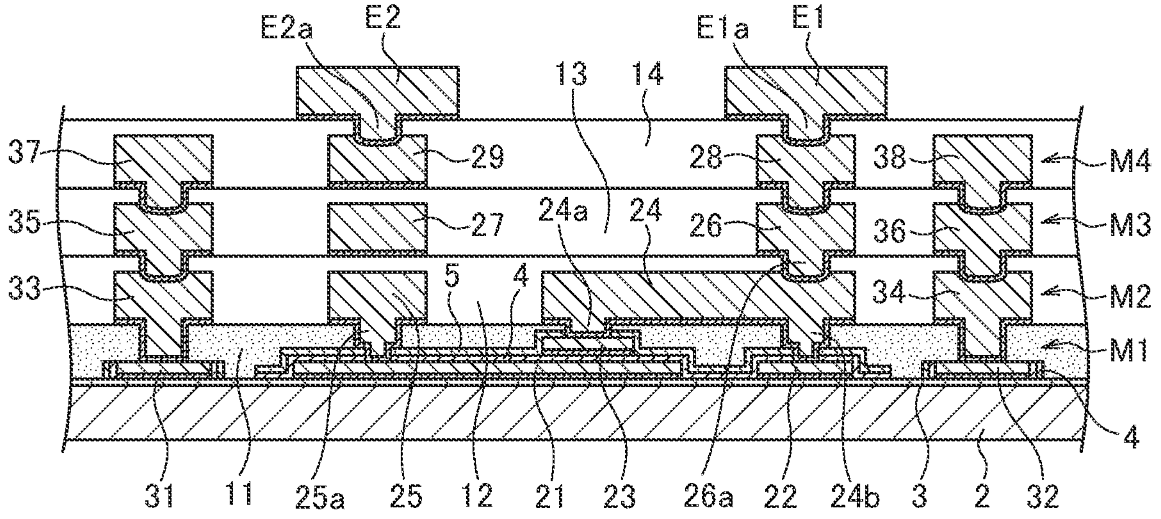
FIG. 21 is a process view for explaining the manufacturing method for the electronic component 1.

Then, as illustrated in FIG. 20, the insulating resin layer 14 is subjected to laser processing to form openings 61 and 62. As a result, the upper surfaces of the respective conductor patterns 28 and 29 are exposed through the openings 61 and 62, respectively. After that, desmear treatment is performed to remove residues inside the openings 61 and 62 and, at the same time, recesses 28R and 29R are formed in the surfaces of the conductor patterns 28 and 29, respectively. Then, as illustrated in FIG. 21, the terminal electrodes E1 and E2 are formed on the insulating resin layer 14. The terminal electrode E1 is connected to the conductor pattern 28 through an opening formed in the insulating resin layer 14, and the terminal electrode E2 is connected to the conductor pattern 29 through an opening formed in the insulating resin layer 14. Parts of the terminal electrodes E1 and E2 that are positioned inside the openings of the insulating resin layer 14 constitute the via conductors Ela and E2*a*, respectively, and the bottoms thereof are projected so as to bite into the recesses 28R and 29R.

Figure 22:
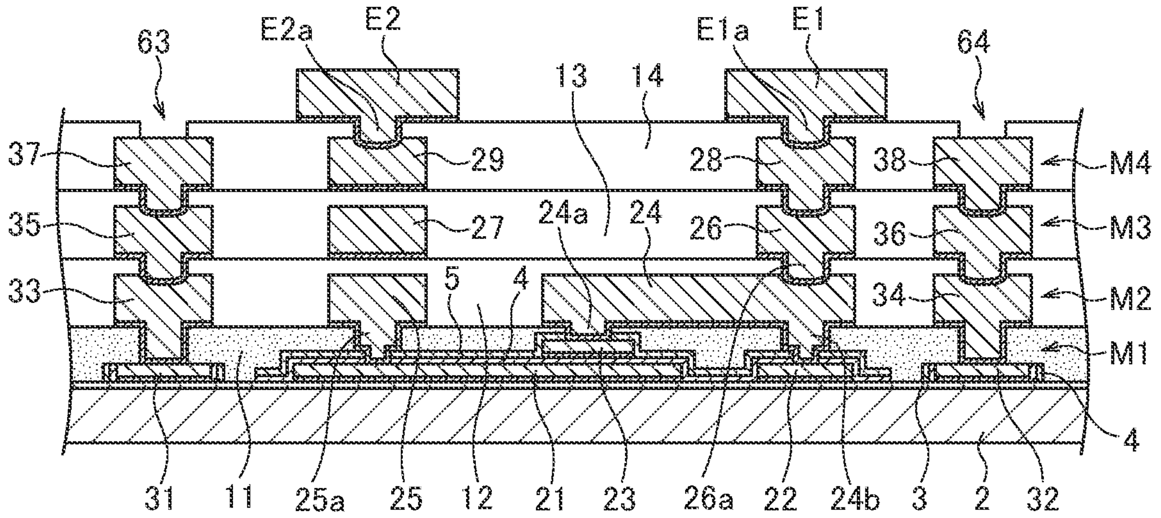
FIG. 22 is a process view for explaining the manufacturing method for the electronic component 1.
Figure 23:
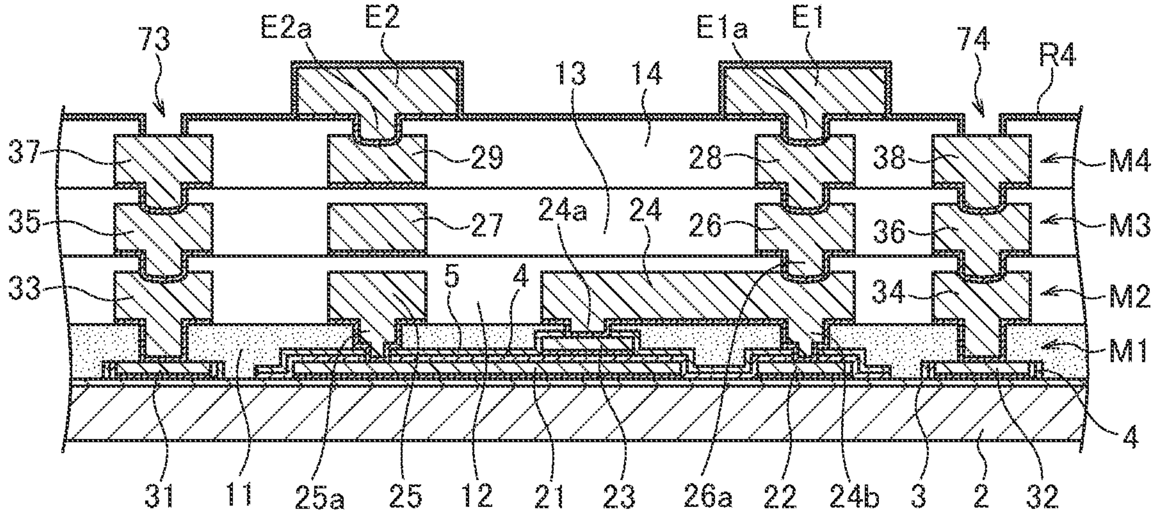
FIG. 23 is a process view for explaining the manufacturing method for the electronic component 1.
Figure 24:
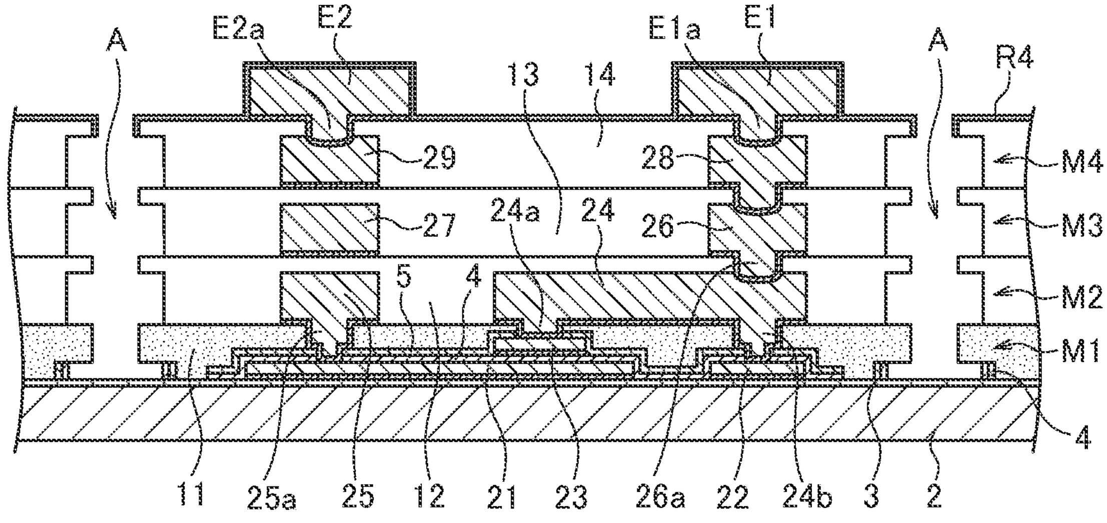
FIG. 24 is a process view for explaining the manufacturing method for the electronic component 1.

Then, as illustrated in FIG. 22, the insulating resin layer 14 is patterned to form openings 63 and 64. As a result, the upper surfaces of the sacrificial patterns 37 and 38 are exposed through the openings 63 and 64, respectively. Then, as illustrated in FIG. 23, a resist layer R4 is formed on the entire surface of the insulating resin layer 14 including the terminal electrodes E1 and E2, and then openings 73 and 74 exposing the sacrificial patterns 37 and 38 are formed in the resist layer R4. In this state, etching using acid or the like is performed to remove the sacrificial patterns 31 to 38, with the result that spaces A are formed in the areas where the sacrificial patterns 31 to 38 have been removed, as illustrated in FIG. 24.

Then, after removal of the resist layer R4, the substrate 2 is cut along the spaces A to individualize the electronic component 1. As a result, the electronic component 1 according to the present embodiment is completed.

As described above, in the electronic component 1 according to the present embodiment, the material and thickness of the insulating resin layer 11 positioned in the lowermost layer are different from those of each of the insulating resin layers 12 to 14 positioned on the insulating resin layer 11. Specifically, the insulating resin layer 11 is smaller in thickness than the insulating resin layers 12 to 14, and the insulating resin layers 12 to 14 are smaller in thermal expansion coefficient than the insulating resin layer 11. Thus, a capacitor requiring high processing accuracy can be embedded in the insulating resin layer 11 having a small thickness, and an inductor requiring a sufficient conductor thickness can be embedded in the insulating resin layers 12 to 14 each having a large thickness. In addition, since the insulating resin layers 12 to 14 have a small thermal expansion coefficient, the occurrence of warpage and peeling can be suppressed.

Further, in the electronic component 1 according to the present embodiment, the conductor layers M1 and MM each have a flat surface, so that it is possible to suppress variation in capacitance due to the surface irregularity of the lower electrode or upper electrode. On the other hand, the surfaces of the conductor layers M2 to M4 each have a recess, and the bottoms of the via conductors 26*a*, 28*a*, E1*a*, and E2*a* each have a projection biting into the recess of each of the conductor layers M2 to M4. This increases the contact areas between the via conductors 26*a*, 28*a*, Ela, E2*a* and the conductor patterns 24, 26, 28, 29 connected thereto, thereby enhancing adhesion therebetween.

Furthermore, of the via conductors 24*a*, 24*b*, and 25*a*, the via conductor 24*a* connected to the conductor pattern 23 which is the upper electrode is provided so as to penetrate the insulating resin layer 11 and passivation film 5, while the via conductors 25*a* and 24*b* connected respectively to the conductor patterns 21 and 22 which are the lower electrode or coil pattern are provided so as to penetrate the insulating resin layer 11, passivation film 5, and dielectric film 4. This makes it possible to protect the conductor patterns 21 and 22 more effectively.

Figure 25:
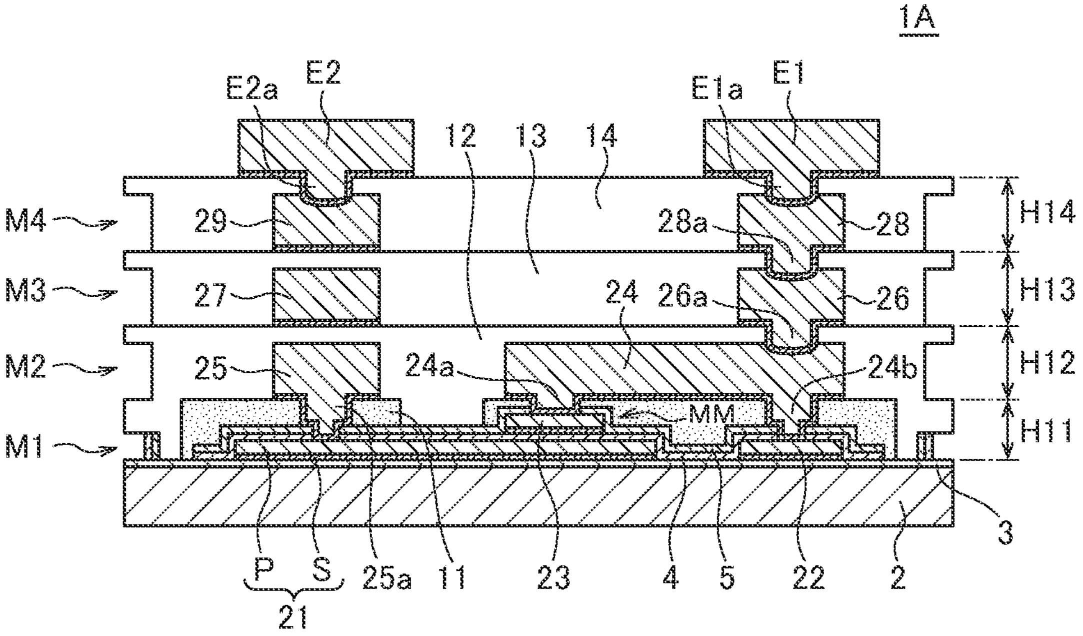
FIG. 25 is a cross-sectional view for explaining the structure of an electronic component 1A according to a first modification.

FIG. 25 is a cross-sectional view for explaining the structure of an electronic component 1A according to a first modification.

The electronic component 1A according to the first modification differs from the electronic component 1 according to the above embodiment in that the insulating resin layer 11 is partly removed in an area not overlapping the coil pattern and that the insulating resin layer 12 is embedded in the area where the insulating resin layer 11 has been removed. The embedded insulating resin layer 12 is in contact with the planarizing layer 3 or passivation film 5, and the thickness of the insulating resin layer 12 is locally increased at the contact portion. Other basic configurations are the same as those of the electronic component 1 according to the above embodiment, so the same reference numerals are given to the same elements, and overlapping description will be omitted. According to the electronic component 1A of the first modification, the insulating resin layer 12 having a small thermal expansion coefficient increases in volume, so that warpage of the entire electronic component 1 is much less likely to occur.

Figure 26:
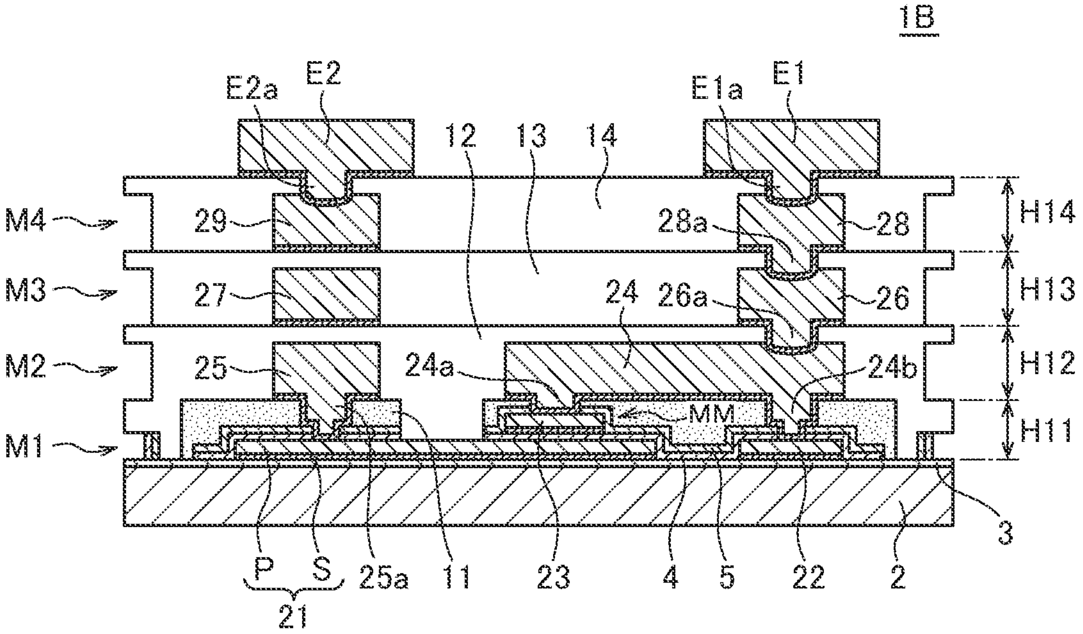
FIG. 26 is a cross-sectional view for explaining the structure of an electronic component 1B according to a second modification.

FIG. 26 is a cross-sectional view for explaining the structure of an electronic component 1B according to a second modification.

The electronic component 1B according to the second modification differs from the electronic component 1A according to the first modification in that the dielectric film 4 and passivation film 5 are removed at the removal area of the insulating resin layer 11. The embedded insulating resin layer 12 is in contact with the planarizing layer 3 or conductor pattern 21. Other basic configurations are the same as those of the electronic component 1A according to the first modification, so the same reference numerals are given to the same elements, and overlapping description will be omitted. According to the electronic component 1B of the second modification, the insulating resin layer 12 having a small thermal expansion coefficient further increases in volume, so that warpage of the entire electronic component 1 is still much less likely to occur. Further, the dielectric film 4 and passivation film 5 are partly removed, so that stress due to the presence of the dielectric film 4 and passivation film 5 is relieved.

While the preferred embodiment of the present invention has been described, the present invention is not limited to the above embodiment, and various modifications may be made within the scope of the present invention, and all such modifications are included in the present invention.

For example, although the present invention is applied to an LC filter in the above embodiment, the present invention can be applied not only to the LC filter but also to electronic components of other types.

REFERENCE SIGNS LIST

1, 1A, 1B electronic component
2 substrate
3 planarizing layer
4 dielectric film
5 passivation film
11-14 insulating resin layer
21-29 conductor pattern
24*a*, 24*b*, 25*a*, 26*a*, 28*a*, Ela, E2*a* via conductor
24R, 28R, 29R recess
31-38 sacrificial pattern
41-45, 51-56, 61-64, 73, 74
A space
E1, E2 terminal electrode
M1-M4, MM conductor layer
P plating layer
R1-R4 resist layer
S seed layer

What is claimed is:

1. An electronic component comprising:
a substrate; and
a plurality of conductor layers and a plurality of insulating resin layers which are alternately stacked on the substrate,
wherein the plurality of insulating resin layers include a first insulating resin layer positioned in a lowermost layer and a plurality of second insulating resin layers positioned on the first insulating resin layer,
wherein the plurality of conductor layers include a first conductor layer embedded in the first insulating resin layer and a plurality of second conductor layers embedded respectively in the plurality of second insulating resin layers,
wherein the first conductor layer includes a capacitor constituted by a lower electrode and an upper electrode stacked on the lower electrode through a dielectric film made of an inorganic insulating material,
wherein the plurality of second conductor layers include a coil pattern,
wherein the first insulating resin layer is smaller in thickness than each of the second insulating resin layers,
wherein the second insulating resin layers are smaller in thermal expansion coefficient than the first insulating resin layer,
wherein the first insulating resin layer is partly removed, and
wherein one of the plurality of second insulating resin layers that contacts the first insulating resin layer is embedded in a portion where the first insulating resin layer has been removed.

2. The electronic component as claimed in claim 1, wherein the first insulating resin layer is made of polyimide-based resin.

3. The electronic component as claimed in claim 2, wherein the second insulating resin layers are made of a material obtained by adding fillers to epoxy-based resin.

4. The electronic component as claimed in claim 1, wherein the second insulating resin layers are made of a material obtained by adding fillers to epoxy-based resin.

5. The electronic component as claimed in claim 1, wherein each of the plurality of second conductor layers has a larger thickness than a total thickness of the upper and lower electrodes.

6. The electronic component as claimed in claim 1,
wherein a first via conductor provided so as to penetrate the first insulating resin layer and connecting the first and second conductor layers has a rectangular planar shape, and
wherein a second via conductor provided so as to penetrate the second insulating resin layer and connecting different second conductor layers has a circular planar shape.

7. The electronic component as claimed in claim 1,
wherein the second conductor layer has a first via conductor and a second via conductor, the first via conductor being provided so as to penetrate the first insulating resin layer and connecting the first conductor layer and one of a plurality of the second conductor layers that is positioned in a lowermost layer, the second via conductor being provided so as to penetrate the second insulating resin layers and connecting the plurality of second insulating resin layers,
wherein the first via conductor has a flat bottom,
wherein a surfaces of the plurality of second conductor layers each have a recess at a portion thereof connected to the second via conductor, and
wherein a bottom of the second via conductor is projected so as to bite into the recess.

8. The electronic component as claimed in claim 7, wherein the first via conductor has a rectangular planar shape, and the second via conductor has a circular planar shape.

9. The electronic component as claimed in claim 8, wherein each of the plurality of second conductor layers has a larger thickness than a total thickness of the upper and lower electrodes.

10. The electronic component as claimed in claim 7, wherein each of the plurality of second conductor layers has a larger thickness than a total thickness of the upper and lower electrodes.

* * * * *